United States Patent [19]
Patil

[11] 4,068,214
[45] Jan. 10, 1978

[54] ASYNCHRONOUS LOGIC ARRAY

[75] Inventor: Suhas S. Patil, Salt Lake City, Utah

[73] Assignee: Massachusetts Institute of Technology, Cambridge, Mass.

[21] Appl. No.: 751,519

[22] Filed: Dec. 16, 1976

Related U.S. Application Data

[63] Continuation of Ser. No. 654,943, Feb. 3, 1976, abandoned.

[51] Int. Cl.² .............................................. H04Q 5/14
[52] U.S. Cl. ......................... 340/166 R; 340/147 LP; 340/147 C
[58] Field of Search ......... 340/166 R, 147 LP, 147 C; 179/15 BA, 18 YA

[56] References Cited
U.S. PATENT DOCUMENTS
3,601,807  8/1971  Beausoleil ........................ 340/166 R Primary Examiner—Harold I. Pitts
Attorney, Agent, or Firm—Arthur A. Smith, Jr.; Martin M. Santa; Robert Shaw

[57] ABSTRACT

An asynchronous logic array capable of directly implementing Petri net specification of digital systems is disclosed. The array can be used in general synthesis of asynchronous digital circuits and systems. The parallel nature of the array gives the realized systems the speed and other characteristics of hard wired circuits even though they are realized from a uniform logic array. The logic array is particularly suited for implementing control circuits and promises to extend the field of micro programming to asynchronous and parallel computers.

1 Claim, 24 Drawing Figures (a)

(b)

(c)

EXAMPLE OF AN INDUSTRIAL CONTROL (a) THE ARRAY (b) THE CELL CONFIGURATIONS

A CIRCUIT IMPLEMENTATION OF THE LOGIC ARRAY (a)
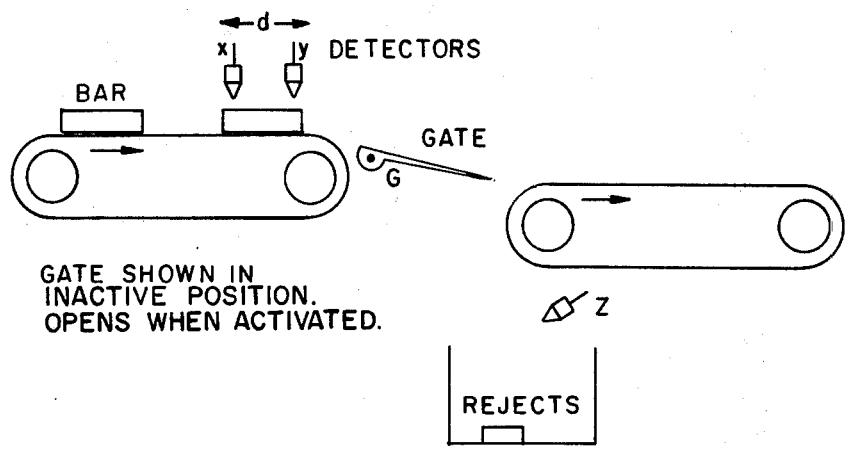
(b)
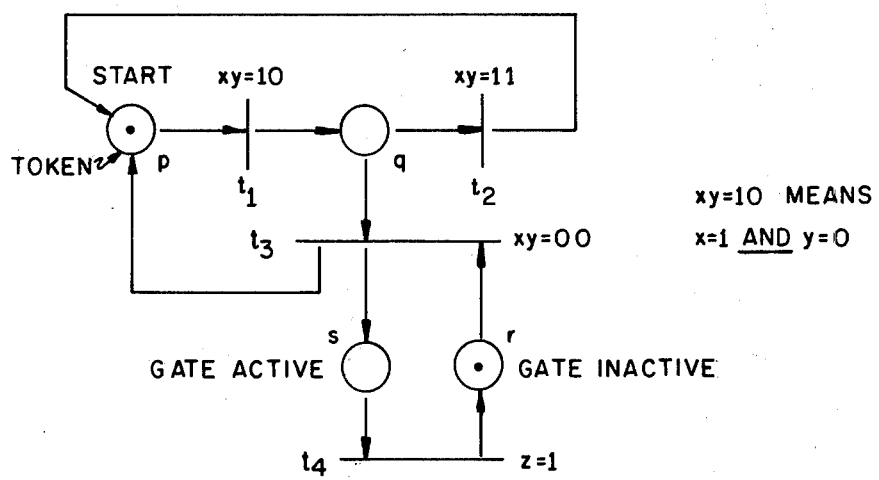
xy=10 MEANS
x=1 AND y=0
(c)
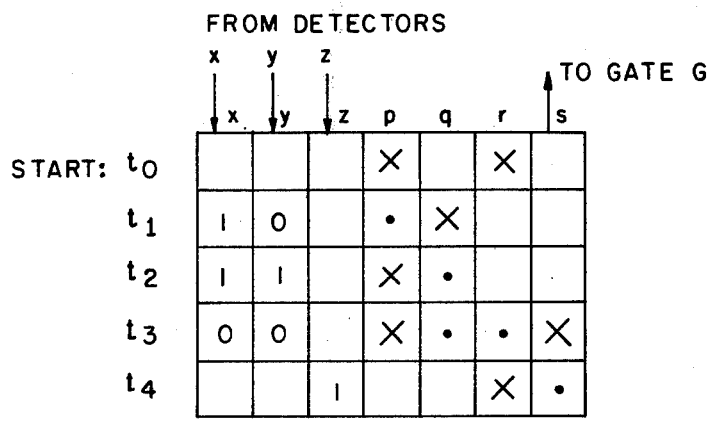
*FIG. 1* EXAMPLE OF AN INDUSTRIAL CONTROL

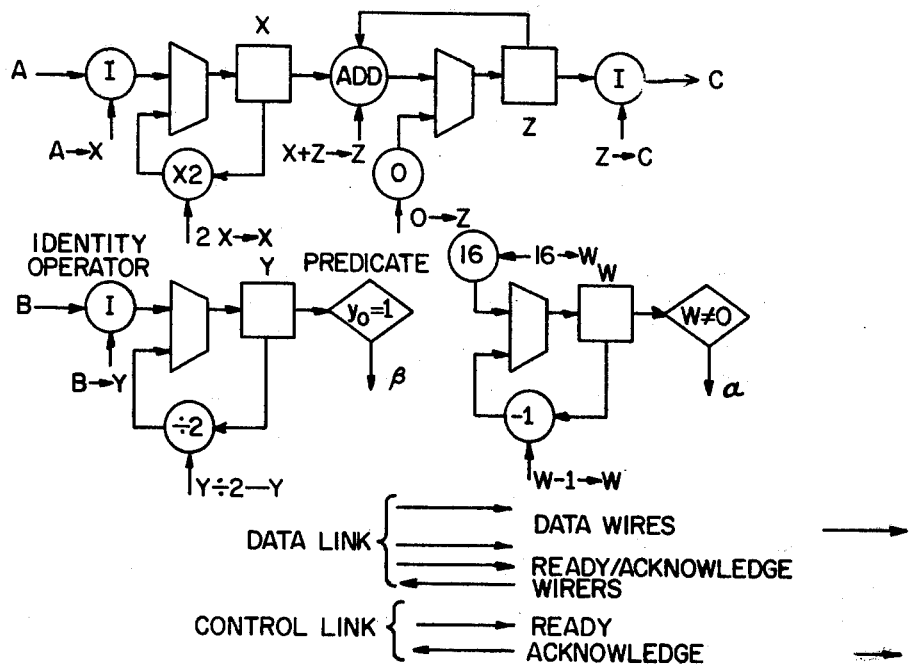
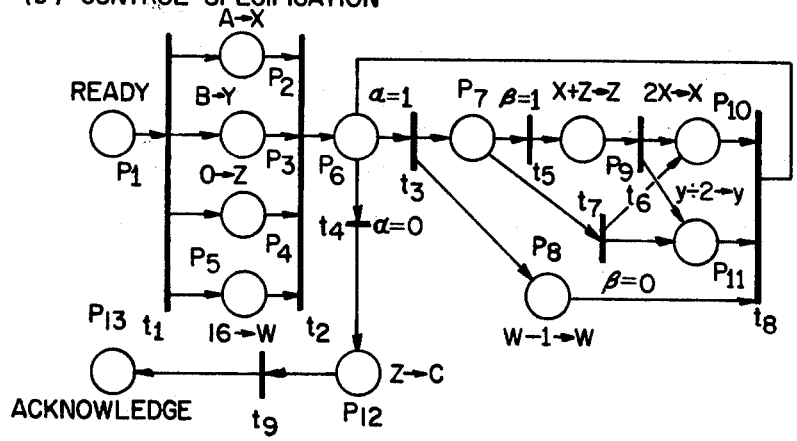
FIG. 2   A MULTIPLIER

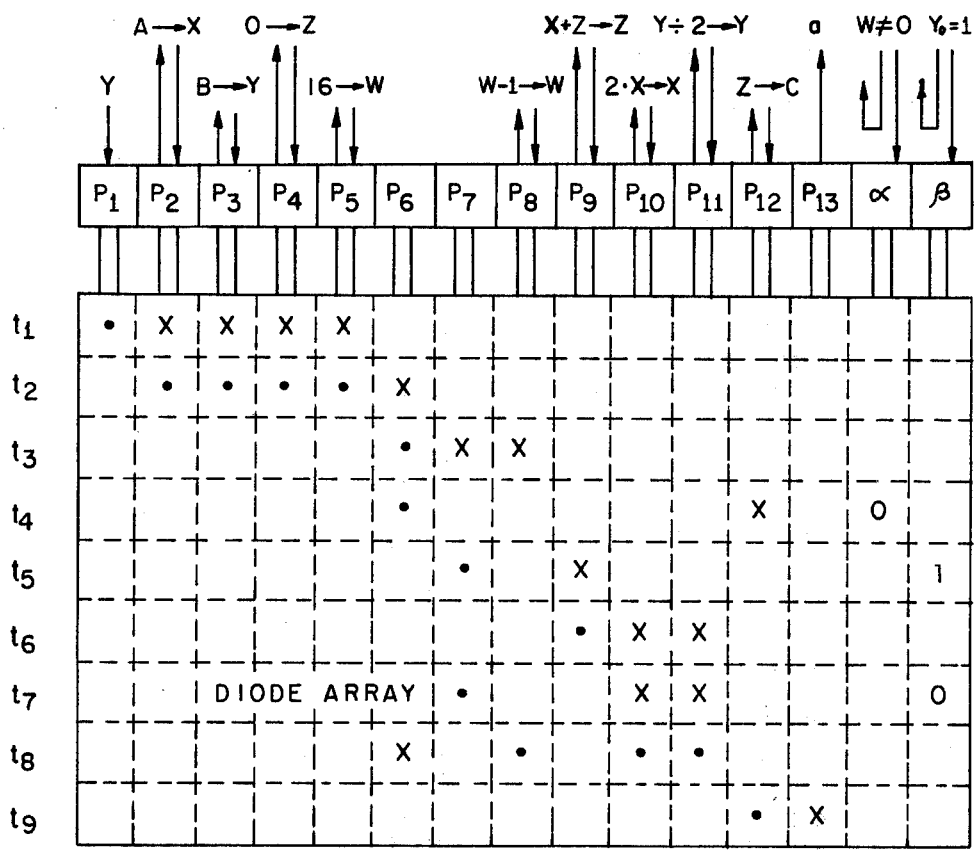
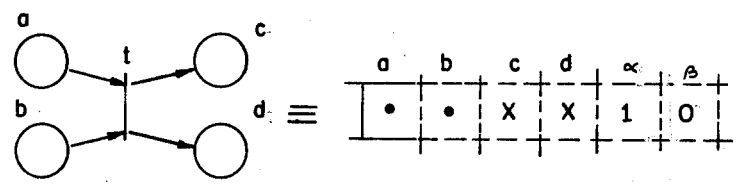
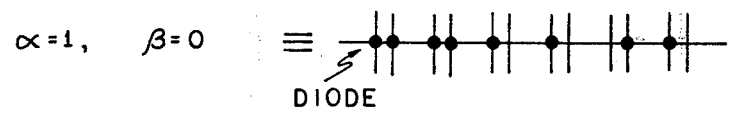
FIG. 3 LOGIC ARRAY IMPLEMENTATION OF THE CONTROL OF THE MULTIPLIER (a) DATA-FLOW PART
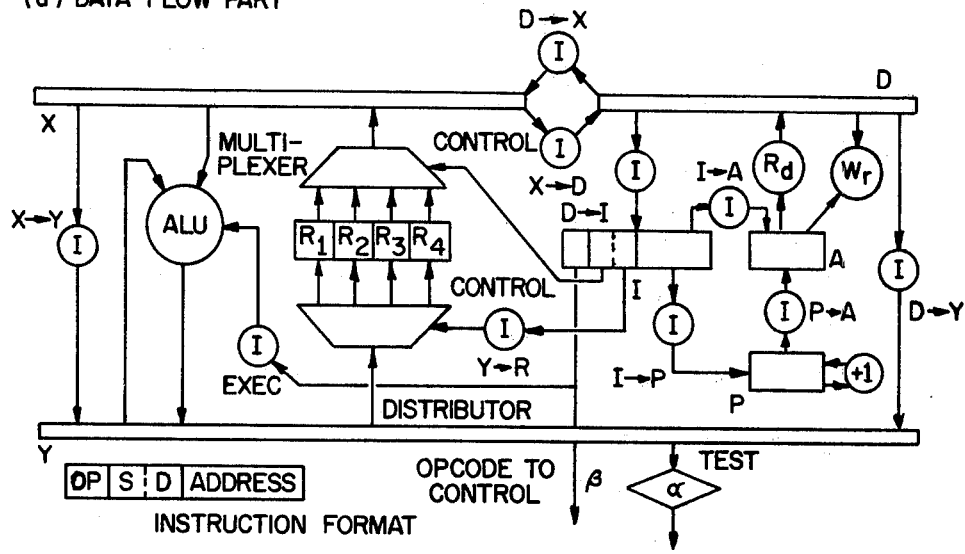
(b) CONTROL SPECIFICATION
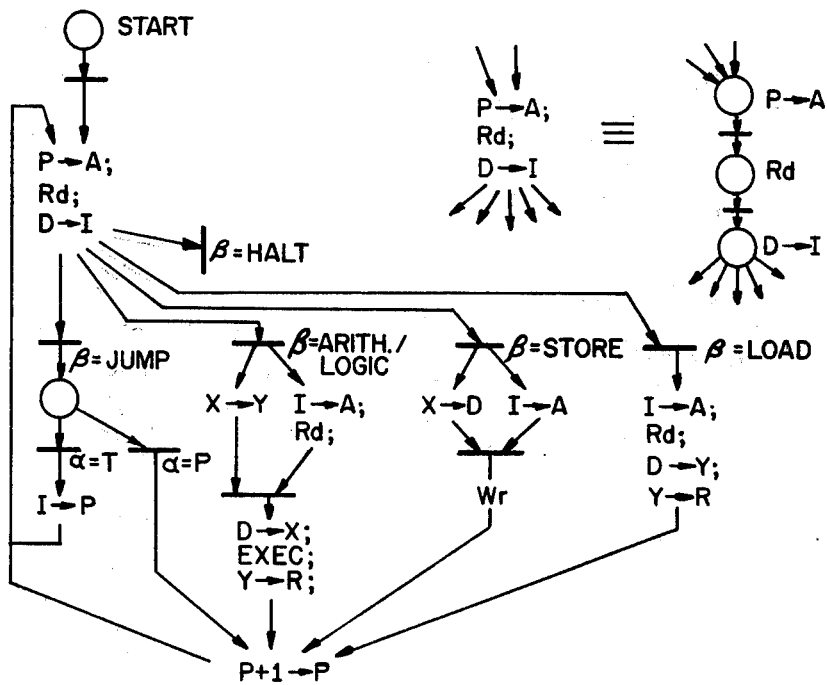
FIG. 4 A CONVENTIONAL PROCESSOR

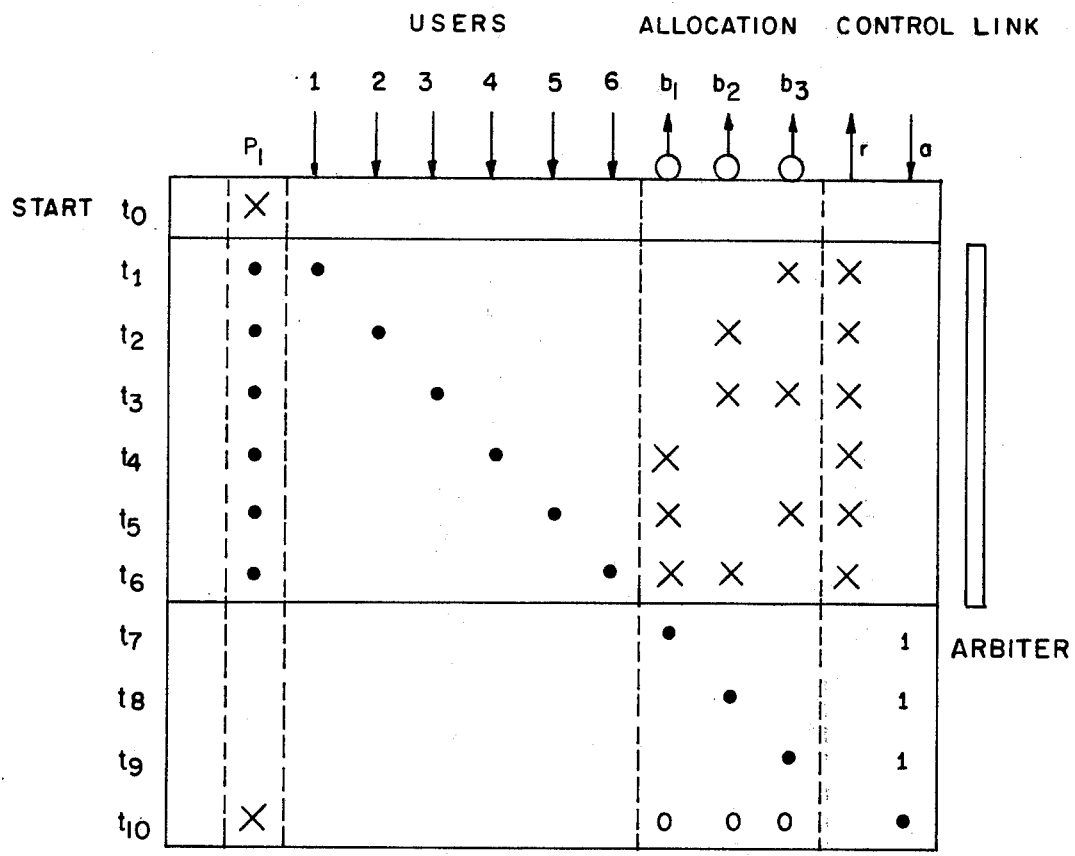
FIG. 5  ALLOCATION OF SHARED RESOURCE (a) THE ARRAY
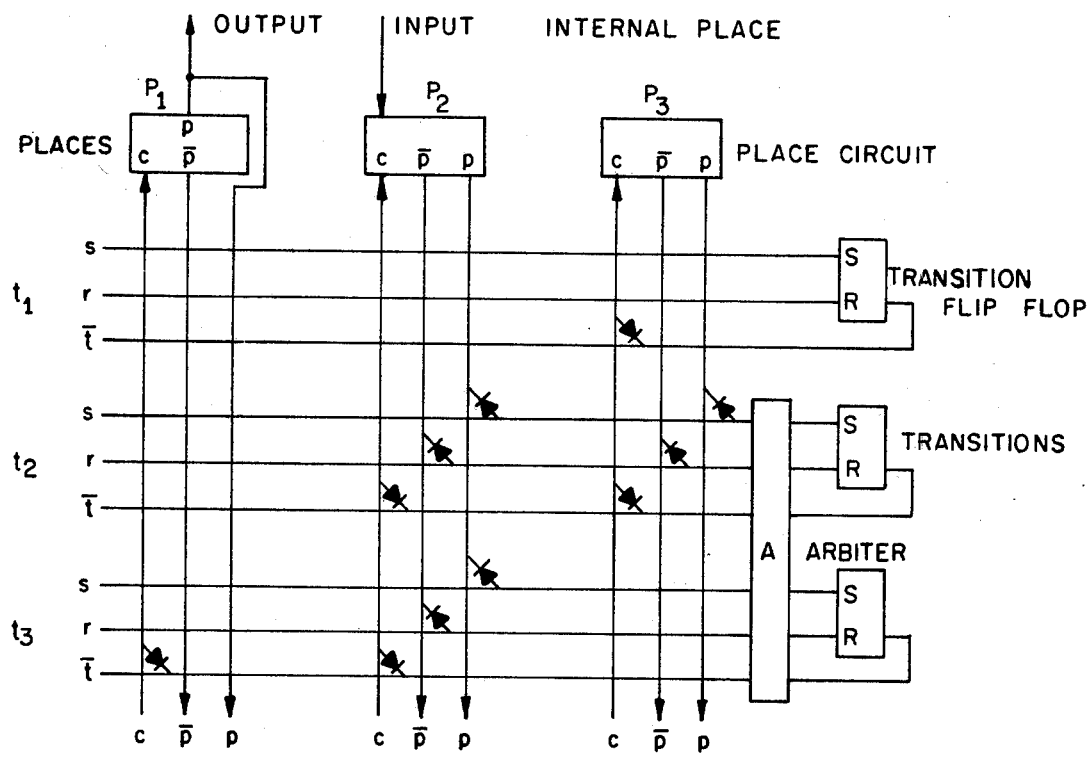
(b) THE CELL CONFIGURATIONS
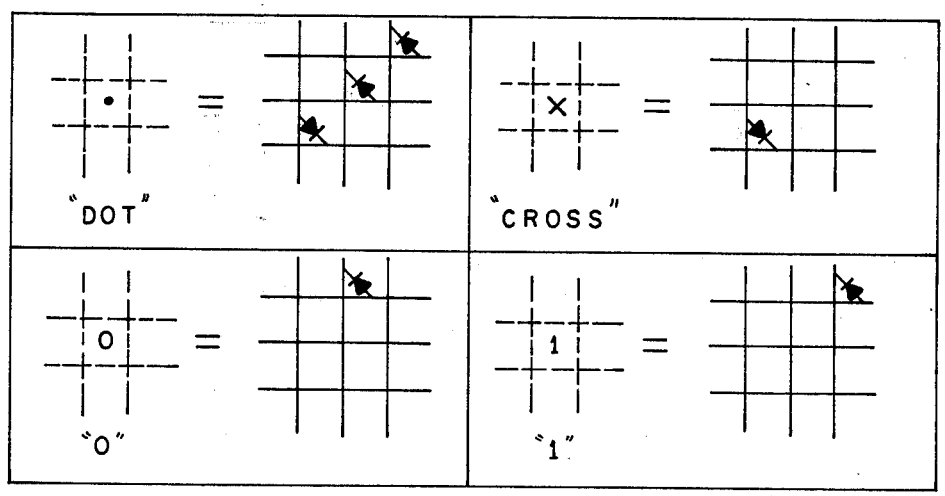
*FIG. 6* A CIRCUIT IMPLEMENTATION OF THE LOGIC ARRAY (a) OUTPUT PLACE CIRCUIT
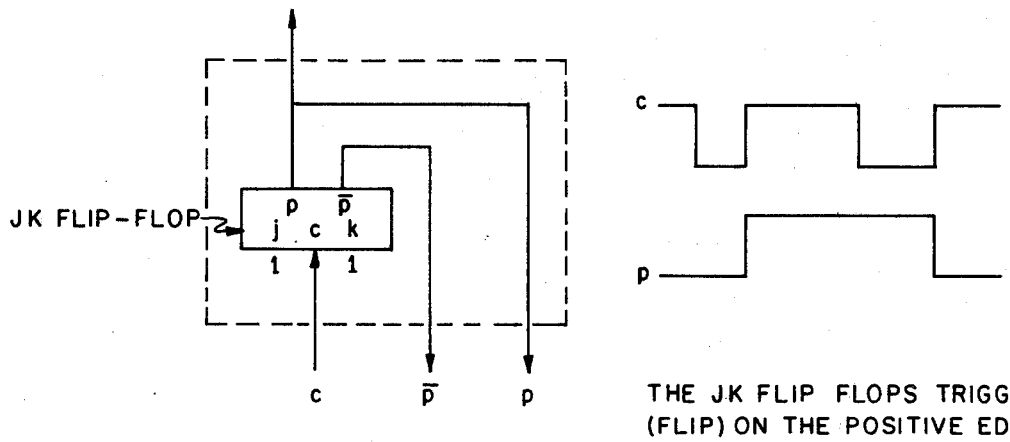
THE JK FLIP FLOPS TRIGGER (FLIP) ON THE POSITIVE EDGE OF INPUT C.
(b) INPUT PLACE CIRCUIT
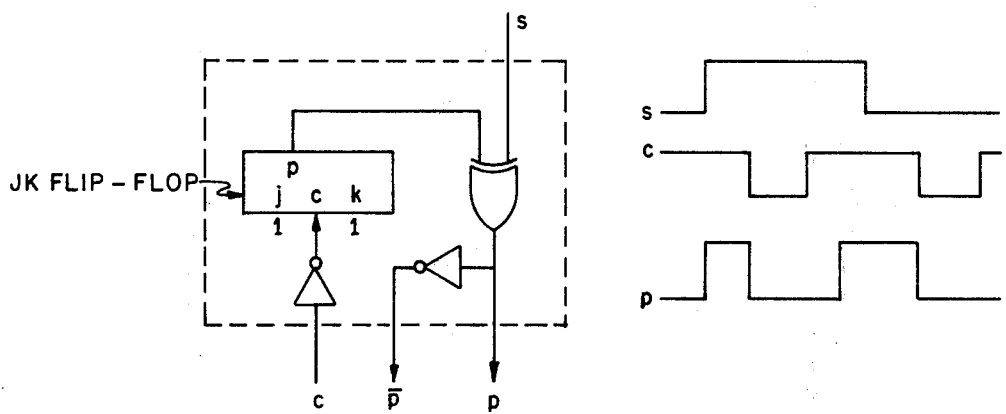
(c) INTERNAL PLACE CIRCUIT
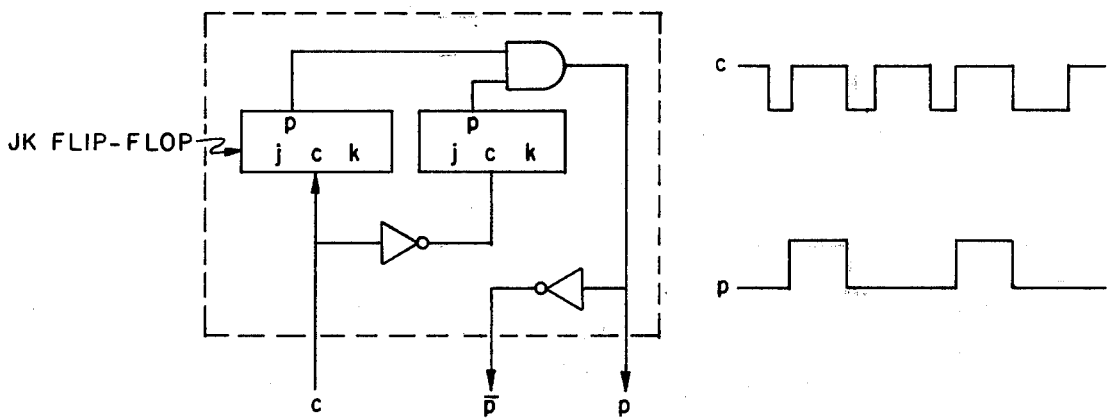
*FIG. 7* THE PLACE CIRCUITS

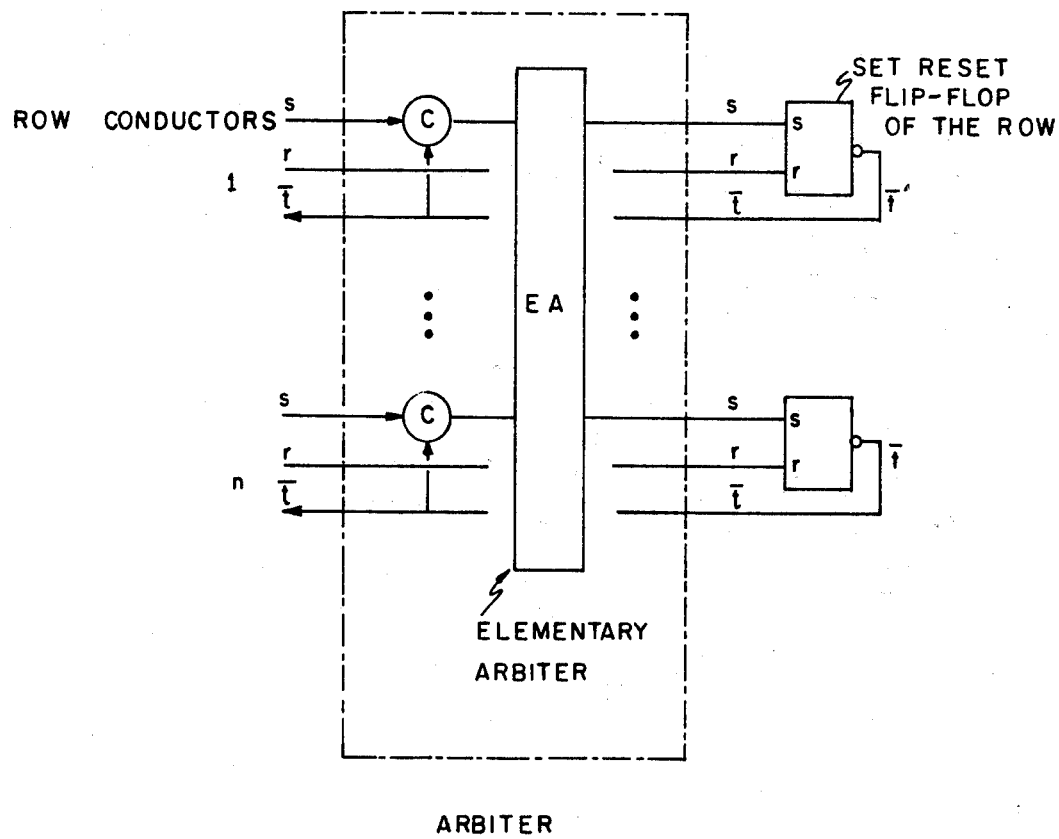
FIG. 8 ARBITER

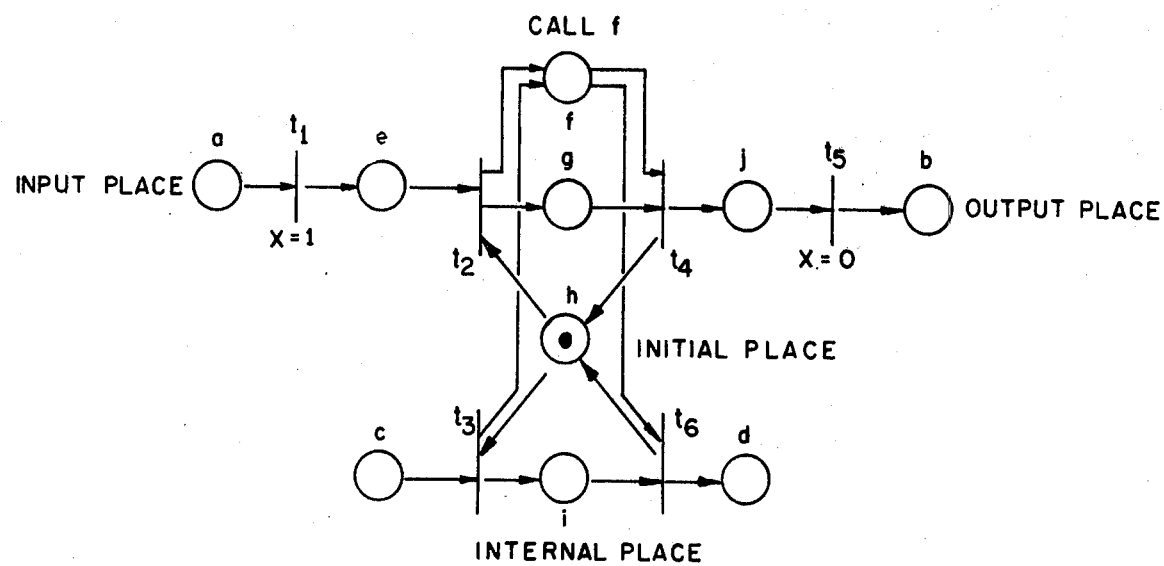
FIG. 9 PETRI NET SPECIFICATION
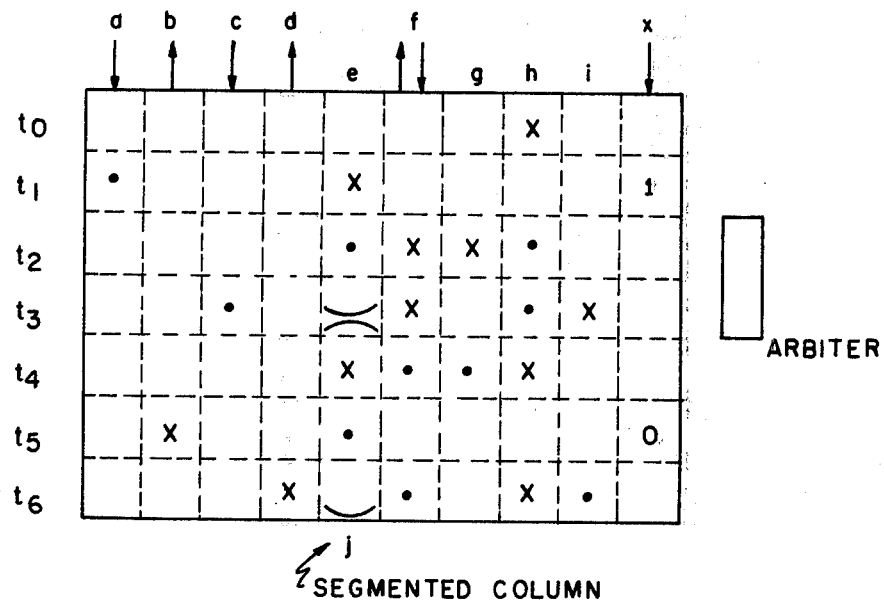
FIG. 10 MATRIX REPRESENTATION

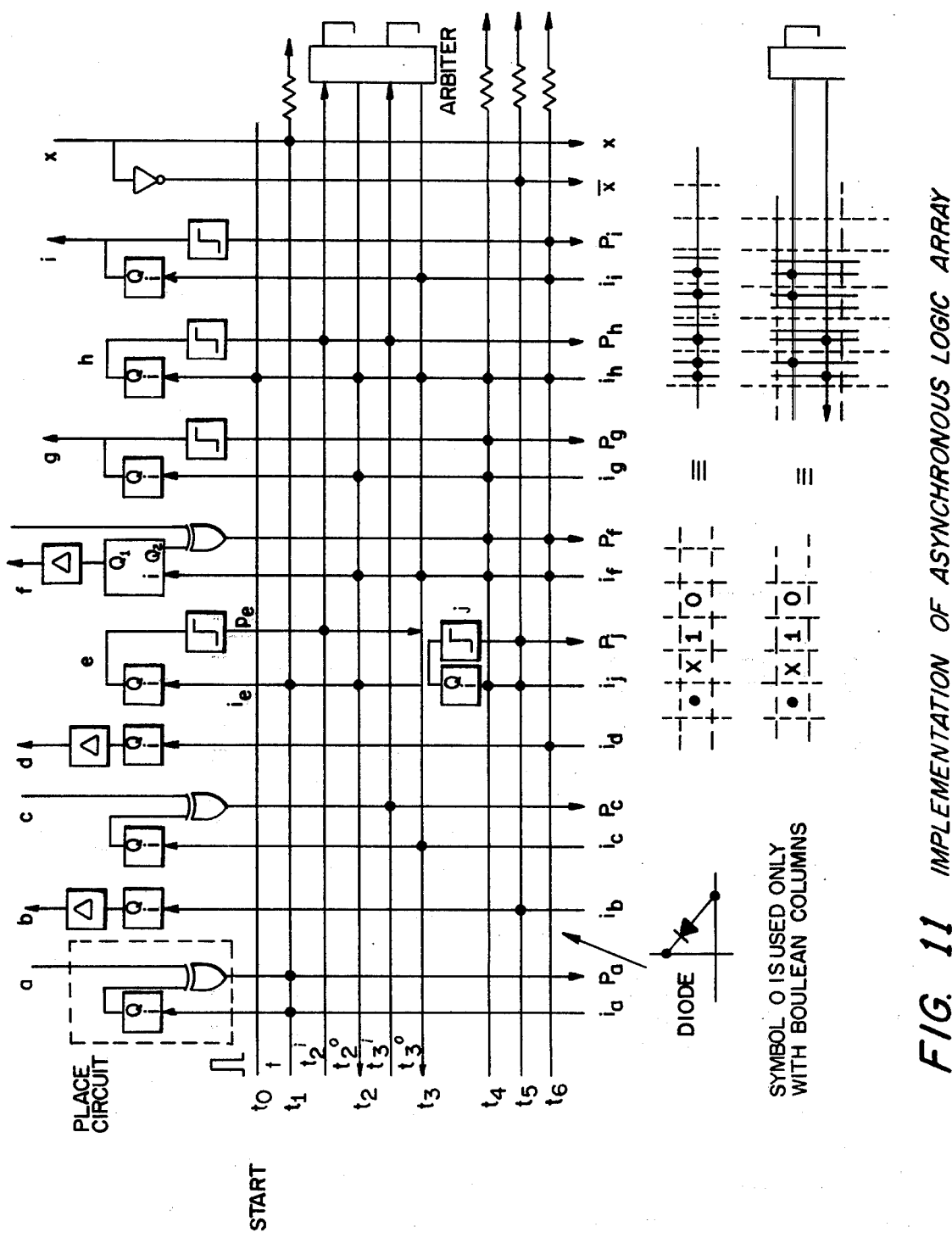
FIG. 11 IMPLEMENTATION OF ASYNCHRONOUS LOGIC ARRAY

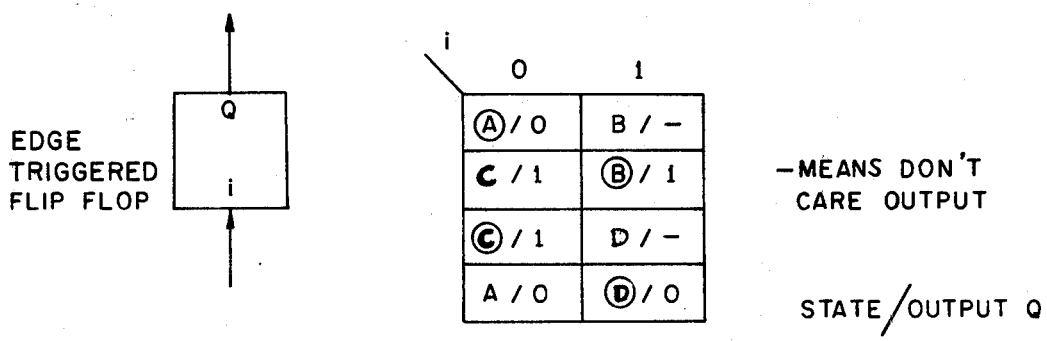
FIG. 12 DEFINITION OF THE EDGE TRIGGERED FLIP FLOP
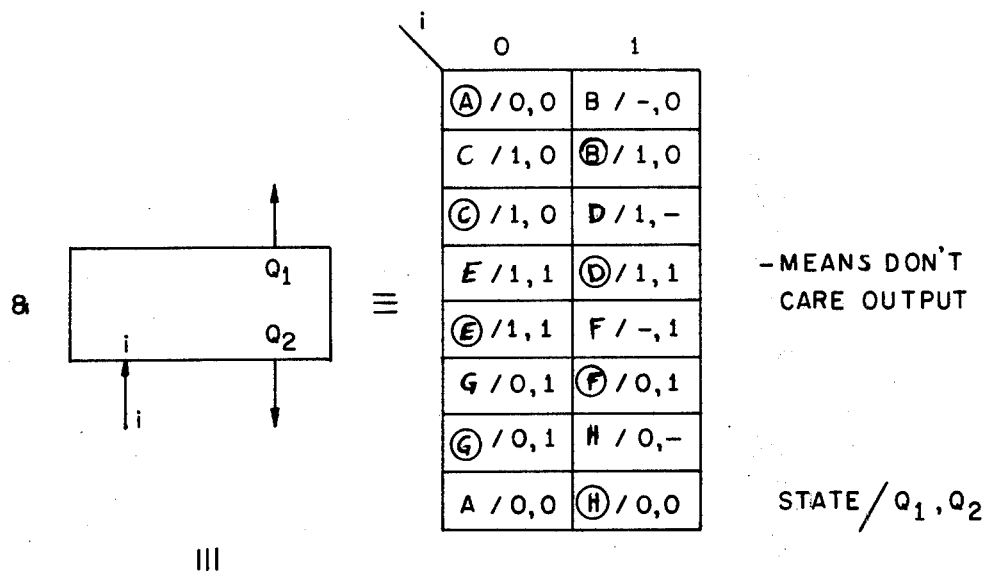
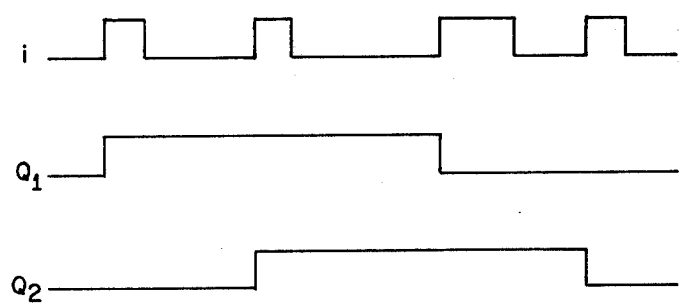
FIG. 13 DEFINITION OF CIRCUITS a)
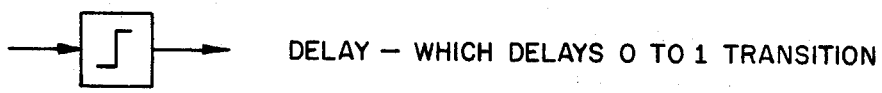
DELAY — WHICH DELAYS 0 TO 1 TRANSITION
DELAY — WHICH DELAYS BOTH 0 TO 1 AND 1 TO 0 TRANSITIONS
b)
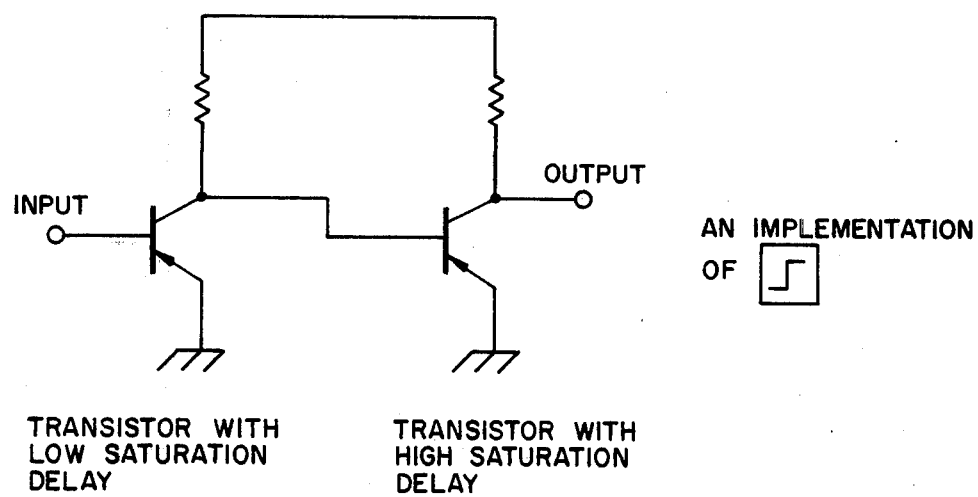
TRANSISTOR WITH LOW SATURATION DELAY
TRANSISTOR WITH HIGH SATURATION DELAY
*FIG. 14* DEFINITION OF THE DELAYS a)
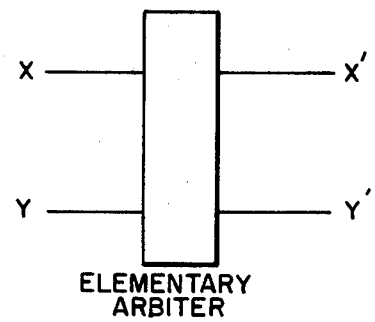
ELEMENTARY
ARBITER
THE ARBITER HAS A LATENCY DELAY: WHEN RELEASED IT
WAITS FOR SOME PREDETERMINED LENGTH OF TIME
BEFORE BECOMING READY TO BE ENGAGED AGAIN.
b)
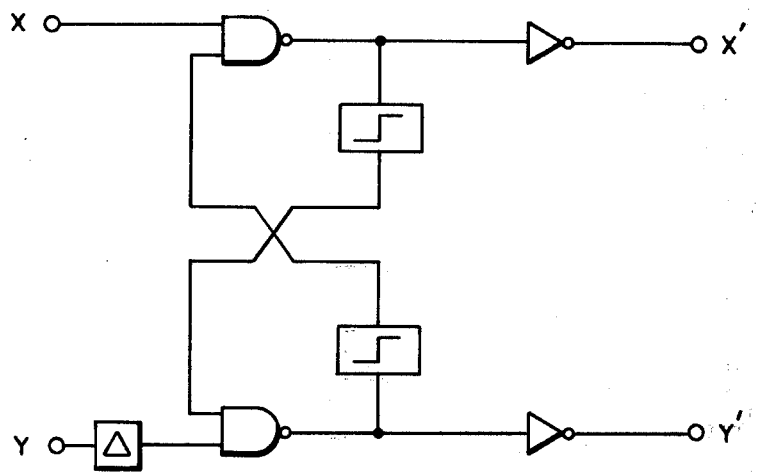
A TWO INPUT ELEMENTARY ARBITER WITH LATENCY
AND BIAS FOR X.
*FIG. 15* ARBITER

ASYNCHRONOUS LOGIC ARRAY

The Government has rights in this invention pursuant to Grant No. DCR74-21822 and IPA-0010 awarded by the National Science Foundation.

BACKGROUND OF THE INVENTION

The invention relates to the area of digital logic circuits in general an to the area of programmable logic arrays in particular. The invention disclosed herein is that of a functionally new logic array capable of directly implementing circuits specified with Petri nets (a means similar to finite state machines for specification of digital systems, but more powerful than state machine particularly in specifying parallel processing and asynchronous digital logic circuits). The array is capable of both synchronous and asynchronous operation.

In comparison with asynchronous digital systems implemented with the disclosed logic array have the advantage that they can be analyzed for logic of prior art, the systems implemented with correctness of operation using the vast theoretical results which have been obtained for analyzing Petri nets. A very important characteristic of the disclosed logic array is that the Petri net specification of the digital system is faithfully realized by the implementation in the array. The correctness of the digital system can therefore be completely analyzed by analyzing the Petri net specification and thus eliminate the need for electronically testing the implemented digital systems.

DESCRIPTION OF PRIOR ART

The possibility that any desired digital logic circuit can be realized from a universal programmable logic array is very attractive and has captured the interest of many people. The prior art of programmable logic arrays regards logic arrays as a means of implementing Boolean expressions with possible feedback to obtain sequential operation (Greer, U.S. Pat. No. 3,816,725, June 11, 1974). Some have extended such logic arrays along the classical line by introducing clocked flip-flops in the feedback paths to form a synchronous circuit (R. A. Wood, High Speed Dynamic Programmable Logic Array Chip, IBM Journal or Research and Development, July, 1975). In the logic array with direct feedback, the array basically implements combinational circuits that correspond to some Boolean expressions; the sequential circuits are obtained by providing direct feedback from one part of the array to another. The resulting circuits are asynchronous circuits of classical kind and are prone to timing hazards well known to designers of logic circuits. Potential timing hazards in such circuits are hard to detect even with electronic testing but are very damaging for correct operation of the circuits.

Clocked synchronous circuits (and the clocked synchronous logic arrays) are able to cope with internal timing problems but are unable to cope with timing problems which arise in communicating with other systems not synchronized to the same clock.

Digital systems must often communicate with other systems asynchronously (communication between a control processing unit of a computer and a peripheral input/output device is a typical example). In order for the synchronous system to correctly handle the asynchronous communication some means for synchronizing the asynchronous communication must be provided. The need to do this increases the complexity of the digital sytem and also introduces additional delay in operation of the system. Much worse though is the fact that theoretical research on this subject has shown that because of critical timing problems that a synchronizer must handle, it is not possible to guarantee correct operation of a physically implemented synchronizer no matter how cleverly it is designed. Asynchronous ditigal systems have an advantage in this regard because asynchronous communication poses no problem for them.

The ability to implement asynchronous systems with logic arrays is therefore very important. The disclosed logic array is a structured array and implements asynchronous logic circuits in structured way. It is because of its suitable structure that it is able to avoid timing problems which often plague asynchronous logic circuits designed with the classical method of asynchronous switching circuit theory.

FUNCTIONAL SPECIFICATION OF THE NEW LOGIC ARRAY

The array can be viewed as consisting of columns and rows. The portion of the array which is common to a row and a column is called a cell. A cell can be in one of several configuration and accordingly establishes one of different possible type of connection between the column and the row. Input/output connections from the outside are normally connected to the columns (they may also be connected the rows if desired).

The cells of the array can be placed in one of five configurations which we shall symbolically denote by dot (.), cross (x), zero (0), one (1) and null (meaning no connection). When the cell connecting a column and row, for example, is in the configuration dot (.) we say that the column is connected to the row by a dot (.). Other types of connections are defined similarly. In the array a column can be in one of two states, 0 and 1.

The basic operation of the array is as follows: a row fires when columns connected to it by either a dot or a one are all in state 1 and columns connected by zero are in state 0. The firing of a row complements the state of all columns connected to it by either a dot or a cross.

The state of columns connected to the row by either 0 or 1 is not affected nor is the state of the column connected by null affected by the firing. (the null connection in fact means no connection).

Rows are also called transitions; they alter states of the columns. Columns are called places and represents internal states or Boolean inputs or outputs.

A logic circuit establishes a logical connection between the input and output wires and the columns. Logic signals on the inputs produces changes in the state of the columns. Changes in the state of column produce logic signals on the output wires if any output wires are connected to them. A preferred logical connection is one in which each column has one input and one output wire. A change in the logic level of the input wire flips the state of the column and the output wire simply reflects the state of the column.

Normally all rows operate in parallel independent of each other. It is therefore conceivable that two or more of them may fire simultaneously. This is a very desirable feature because it leads to parallel operations. But sometimes it is desired that among a group of transitions, the transitions should fire one at a time. This task is realized by an arbiter. An arbiter spans a number of rows. An arbiter ensures that rows connected to it fire one at a time, in accordance with some priority scheme. A preferred priority scheme is one in which preference is given to the transition closest to the top in event of simultaneous attempts to fire by two or more transitions covered by the arbiter.

BRIEF DESCRIPTION OF THE DRAWINGS

A better understanding of the invention will be had by now referring to the preferred embodiments thereof, as illustrated in the accompanying drawings, in which:

In the Figures

FIG. 1a shows a pictorial view of an industrial process.

FIG. 1b shows a Petri net representation of a control for the process of FIG. 1a.

FIG. 1c is a schematic representation of the array implementation of the Petri net of FIG. 1b.

FIG. 2a is a block diagram of a multiplier.

FIG. 2b is a Petri net controller for the block diagram of the multiplier of FIG. 2a.

FIG. 3 shows a logic array implementation of the controller of the multiplier of FIG. 2a.

FIG. 4a shows a data flow part of a conventional processor.

FIG. 4b is the control specification of a conventional processor.

FIG. 5 shows the allocation of shared resource.

FIG. 6a is a circuit diagram of the logic array.

FIG. 6b is the cell configuration of the logic array.

FIGS. 7a, b, and c show the circuit diagrams of the output, input and the internal places.

FIG. 8 is a block diagram of an ARBITER.

FIG. 9 is a Petri net showing a shared process.

FIG. 10 is a schematic of the array representation of the Petri net of FIG. 9.

FIG. 11 is a preferred implementation showing an efficient circuit embodiment of the schematic of FIG. 10.

FIG. 12 is a definition of the edge triggered flip-flop.

FIG. 13 is a definition of the special circuit used in the output place of the circuit of FIG. 12.

FIGS. 14a and b are definitions of the delay elements used in the circuits of FIG. 12.

FIGS. 15a and b respectively show a block diagram and a circuit the ARBITER of FIG. 12.

EXAMPLE

This example implements the control circuit of an industrial sorter for rejecting bars smaller than some specified length $d$. For this purpose two detectors x and y are placed at a distance $d$ apart on the conveyor belt on which the bars move. When a bar is under a detector, the detector senses a 1 otherwise its output is a 0. If a bar is to be rejected, a gate G can be activated to put the bar in the box of the rejects. The gate is activated by an input 1. FIG. 1a shows the physical set up.

FIG. 1b shows a state diagram for the control. The diagram is expressed in the Petri net notation. It consists places (states) drawn as circular and transitions (events) drawn a bars. Tokens can be put in places to denote the current state of the system. For a transition to fire, all input places of the transition must have tokens and the Boolean condition (e.g. $x=1 \cap y=1$) must be satisfied. In the act of firing transition removes one token from each input place and puts one in each output place. (details on Petri nets and its use in specification of state diagrams can be found in published literature).

Interpretation of the diagram 1b is as follows: In the beginning there is a token in place $p$ and there is a token in place $r$. The gate is inactive. As the bar moves under the detector, the value of $xy$ becomes 10, transition $t_1$ then fires. Then place $p$ becomes empty and place $q$ gets a token. Now if the bar is longer than the specified distance $x$ and $y$ both become 1 as the bar moves under the detectors. Then transition $t_2$ fires and we return to the initial condition. (Place $q$ becomes empty and place $p$ gets a token). Gate is not activated and then the bar is not rejected.

On the other hand, if the bar is smaller than the specified distance, then $x$ and $y$ both become 0. Then transition $t_3$ fires instead. Pleace P gets a token ($q$ becomes empty), and place $s$ gets a token ($r$ becomes empty). The gate is now activated. The gate remains active until another detector $z$ detects the rejected piece. At that time $z$ becomes a 1 and $t_4$ fires moving the token from $s$ to $r$ which deactivating the gate.

While a piece is being rejected by the gate, another piece may start to come under the detector but the pieces must be sufficiently apart to allow the rejection process to complete before the next piece completely comes under both detectors.

An asynchronous logic realization of the control logic using the logic array is shown in FIG. 1c. The columns in the array correspond to the inputs from the detectors $x$, $y$ and $z$ and the places $p$, $q$, $r$ and $s$. The rows correspond to the transitions $t_0$ is the initial transition which is automatically fired immediately after the initialization. Its effect is to put the initial tokens in places $p$ and $r$. A dot (.) means input to a transition, a cross ($x$) output of a transition, and 0 and 1 detect the Boolean condition.

It is possible to follow the operation of the control logic entirely from the logic array specification by considering the actions the logic array takes in accordance with its functional specification.

The state of the columns $x$, $y$ and $z$ reflect the state of the detectors. When there is no bar under the detectors, detectors $x$, $y$ and $z$ all put out logic output 0. Accordingly columns $x$, $y$ and $z$ are also in state 0 or "OFF" state. Initially columns $p$, $q$, $r$ and $s$ are set to the state 0 ("OFF" state) and, the "start" row ($t_0$) is fired. Firing of row $t_0$ causes the columns $p$ and $r$ to go into opposite states because they are connected to row $t_0$ by "cross" type of connection. Columns $p$ and $r$ thus turn "ON". This corresponds to the initial tokens being put in places $p$ and $r$. Columns $x$, $y$ and $z$ are still in "OFF" state, and therefore, none of the rows meet the condition for firing; the logic array keeps waiting for some input to change. As the bar moves under detector $x$, the input $x$ to the logic array becomes a 1 and column $x$ turns "ON" (its state becomes a 1). Column $y$ being still "OFF" (state 0) and column $p$ being "ON"L the firing condition for row $t_1$ is satisfied. Row $t_1$ fires causing column $p$ to turn "OFF" and column $q$ to turn "ON" (state of $q$ flips from "OFF" "ON"). The logic array again waits because no further firing of row is possible until detectors $x$ and $y$ either become 1 and 1 or 0 and 0. In the first case row $t_2$ fires turning $q$ "OFF" and $p$ "ON" (the bar had required length; the gate is not operated; the logic circuit returns to initial condition and is ready to handle the next bar). If the bar is short of the required length, $x$ and $y$ become 0 and 0. Then row $t_3$ fires turning $q$ "OFF" and $p$ "ON" and turning column $r$ "OFF" and column $s$ "ON". As the output of column $s$ is connected to gate G and as the "ON" state of column $s$ produces a high (logical) level on the output, gate G is activated and the bar thus moves towards the box of rejects. As the bar passes under the detector z on way to the reject box, the output of detector z becomes a 1 ("ON") (for the duration of the passing of the bar). As soon as output of detector z becomes a 1 column z which is connected to it turns "ON" and row $t_4$ fires turning column s "OFF" and column r "ON". The gate is thus deactivated and the control circuit is back to its initial condition ready to test the next bar.

EXAMPLES OF DIGITAL SYSTEMS

The following two examples show successively complex structured asynchronous digital systems implemented with the logic array performing the control logic. Different parts used in these digital systems are described first:

Each digital system consists of two parts, a data-flow part and a control part. The data flow part has the memory cells and the operators which store and manipulate the data. Data manipulation may involve some transformation on the data or just the transportation of the data from one point to another. The data-carrying paths are called data-links and have a pair of control wires, called ready-acknowledge wires, in addition to the data carrying wires. In the examples which we shall consider here, data is first placed on the data wires and then a signal is sent on the ready wire in the direction of the link to signal that the data is available on the link. The operator or the memory cell (a register) to which the link is connected can take advantage of the signal to initiate action. For example, a memory cell can update its value and send the new data on the output data-links of the cell. Later the cell will receive acknowledge signals on the output-links, and when all acknowledge signals are received it will return a signal on the acknowledge wire of the input data-link (the link from which it received the data).

If a link has only the ready/acknowledge wires and no data wires, then the link is called a control link. Many operators have such control links which originate from the control part and are used by the control to command the operator to perform a pre-designated operation. If the operator is to be commanded to perform one of several actions then a data-link would control the operator; the data on the link will perform the selection of the operation and the ready signal on the link will initiate the operation. A signal on the acknowledge wire will indicate that all the actions that must take place in connection with the execution of the operation have been completed so that the execution of other operations may now be initiated.

Some operators such as the multiplexer unit (FIG. 2) have no control link from the control part because all control signals needed by it are available from the data links. Such operators are called data-flow type operators. In FIG. 2 we use such a unit to take care of multiple fan-in into a memory cell (register). When this unit receives input on any of the input links, it establishes connection between that input and the output and the data is passed on to the output together with a ready signal. When it receives an acknowledge signal from the cell (register), it acknowledges on the input link; the connection between that input link and the output link remains established until data is received from some other input. Normally two inputs would not be sent to it concurrently, but if that situation is possible then an arbiter in the unit would determine which input will be connected to the output first. The data flow part of the system thus uses both schema-type operators and data flow-type operators.

In the examples that are presented here, the operators expect that the data values that are available to it on the data wires of the input link remain at that value until new data is presented so that the need to store the input data in the operator is eliminated. For example, in FIG. 2 the adder returns an acknowledge signal on an input datalink immediately after it receives the data (and the ready signal) but expects the input data to be valid throughout its operation and until a new data is received on the same link. When a ready signal is received on the control link from the control part, the adder assumes that the input data are available at the input, performs the addition, puts new data on the output link and sends a ready signal on the output link. When an acknowledge signal is received on the output link, the adder acknowledge on the control link.

The control part is specified with a Petri net. A Petri net consists of places (drawn as circles) and transitions (drawn as bars) which are connected by directed arcs. Arcs connect only places to transitions and transitions to places. A place may contain a token (we consider only such nets which do not have more than one token in a place); a transition needs a token from each input place to fire. In the act of firing, a transition removes a token from each input place and then puts a token in each output place. If a place represents a call to an operator (FIG. 2) then placing a token in the place results in a ready signal being sent to that operator on a link. This signal commands the operator to perform predesignated action, and when the action is completed, an acknowledge signal is returned on the link by the operator. The token at the place, which was frozen at that place during this time, is then released to be used in the firing of other transitions.

EXAMPLE OF THE MULTIPLIER

The integer multiplier shown in FIG. 2 is based on the long-hand multiplication algorithm. Operands A and B are placed in cells X and Y, respectively. Cell Z is initialized to 0 and cell W to 16 (the number of bits in the word representing the operand Y). Then the numbers equal to operand A multiplied by increasing powers of 2 are successively generated in cell X, and Y is shifted right. If at any stage the least significant bit of Y is a 1 then X is accumulated in Z; otherwise the computation proceeds to the next step.

The multiplier itself can be thought of as an operator, which multiplies A and B to produce result on C. Its operation is initiated by a ready signal which has the effect of putting a token in place $p_1$. When the operation is completed a token appears in place $p_{13}$. Then an acknowledge signal is returned in reply to the ready signal. The pair of places $p_1$ and $p_{13}$ represent a ready-acknowledge link.

When a token is placed in $p_1$, transition $t_1$ fires and initiates operations A → X, B → Y, 0 → Z and 16 → W in parallel. When these operations are performed, transition $t_2$ puts a token in $p_6$. This token leads to the firing of either transition $t_3$ or $t_4$ depending on the Boolean condition of the output of predicate $\alpha$. It may be noted that in the course of performing the operation 16 → W, predicate $\alpha$ gets the new value of W together with a ready signal. The predicate operator then evaluates the predicate and sends the outcome to the control unit on link $\alpha$. When the control receives this value, an acknowledge signal is sent to the predicate. The predicate then returns an acknowledge signal to the cell W. The cell W returns an acknowledge signal to the operator which then acknowledges the completion of the operation $16 \rightarrow$ W. Thus we are guaranteed that before $p_6$ gets a token the machinery to determine which way the token should go is already established.

Firing of transition $t_3$ puts a token $p_7$ (which tests whether a step of accumulating X into Z is to be performed) and a token in $p_8$ (which decrements the value of W by 1). If the lowest order bit of Y is a 0 then $\beta$ will be false and transition $t_7$ will directly put tokens in places $p_{10}$ and $p_{11}$ to prepare the system for the next step in iteration. When X is shifted left (multiplied by 2), Y is shifted right (divided by 2) and W is decremented by 1, transition $t_8$ fires putting a token in $p_6$ to start the next step of the iteration.

After 16 steps of iteration, $\alpha$ becomes false. Then transition $t_4$ puts a token in $p_{12}$ which causes the result of computation to be sent out on the output link C. When an acknowledge signal is received on link C, transition $t_9$ puts a token $p_{13}$ so that the multiplier can reply with an acknowledge signal to indicate that the multiplication has been performed and that the result of the multiplication has been delivered to whoever was supposed to receive it.

IMPLEMENTATION

The components of data flow part can be implemented with the conventional MSI and LSI parts together with some additional circuitry to generate the ready/acknowledge signals. It is not very important what precise mechanism (simple delay or a more sophisticated circuitry to detect the completion of the operation) is used to obtain the ready and acknowledge signals but it is important that the operators and other units of the data-flow part when viewed from the outside conform to their functional behavior.

It possible to systematically implement the control part of the system (which is specified as a Petri net) in the asynchronous logic array. In the array the row wires represent transitions and the columns (consisting of two wires each) represent either places, ready/acknowledge links or Boolean inputs. In one implementation, two diodes at the cell in the interconnection of a row and a column implement the type of arc that connects the transition and the place; the diodes in the cell at the intersection of a Boolean column and a transition determine whether the firing of the transition requires the Boolean column to be in state 1 or 0 (true or false). At the top of the array each column is connected to a circuit of about the same complexity as a flip flop. The input/output wires of the control are connected to these circuits. In the diagram of FIG. 3, which shows an implementation of the control of FIG. 2b, an arc from a transition to a place is represented by a cross (x) and an arc from a place to a transition by a dot (.), and 0 and 1 represent the Boolean condition required for firing of the transition.

One of the important features of the array is that in order to obtain the control part of a system it is sufficient to provide the Petri net specification of the control; the rest of the steps require simple mechanical translation that is guaranteed to produce a physical implementation consistent with the Petri net specification.

EXAMPLE OF A SIMPLE CONVENTIONAL PROCESSOR

FIG. 4 illustrates a conventional processor with four general-purpose registers $R_1, \ldots, R_4$, program counter P, instruction register I, address register A, data register D and buses X and Y. It has one ALU and many (identity) transfer operators to move data from one point to another. The multiplexer puts the contents of the registers designated by the control input into the bus register X, and the distributor puts the contents of Y into a designated register. This processor (which has been composed only for the purpose of illustration) has five types of instruction: transfer, arithmetic/logical operation, load and store and halt. FIG. 4b gives a specification of the control of the processor in an abbreviated notation for Petri nets. In this notation the name of the operations are written in place of the places which represent them and transitions are not drawn when several operations are performed in a single sequence. The control shows the decoding and execution of the instructions.

DIGITAL RESOURCE ALLOCATOR

To examine the operation an arbiter, consider the digital resource allocator described below.

Suppose there are six users who could place requests for a common resource which can be used by at most one user at a time. To allocate the resource on demand from the users we can implement a digital allocator as shown in the logic array of FIG. 5. In this figure, the "ON" state of the column $p_1$ will represent the availability of the resource. Columns 1 to 6 are connected to inputs from the users. The interconnection circuitry is so arranged that when a signal is received on any one of these input wires from a user, the corresponding column is turned "ON". Thus if column 3 is "ON" this means that user 3 is waiting for the resource. If the resource is available (column $p_1$ is "ON"), row $t_3$ can "fire" turning "OFF" columns $p_1$ and $p_3$ and turning "ON" columns $b_2$ and $b_3$ and changing the state of column $r$. If no other user columns are "ON" then transition $t_3$ fires without any opposition and the state of the output wires $b_1$ $b_2$ $b_3$ becomes 011 (the output wires simply reflect the state of the columns to which they are connected) indicating that it is user 3 who has been allocated the resource and the change in level of $r$ represents a signal to the resource to serve the said user. When the use of the resource is completed, a signal on input a turns on column $a$. Rows $t_8$ and $t_9$ fire turning "OFF" columns $b_2$ and $b_3$ and when their firings are completed row $t_{10}$ fires turning $p_1$ "ON" to indicate the availability of the resource. If there are now any waiting users, then one of them is served next.

If, say, user 3 and user 5 simultaneously send request while other users are still not asking for the resource, then both rows $t_3$ and $t_5$ will have their condition for "firing" met, but because of the arbiter row 3 $t_3$ will "fire" first (note arbiter gives priority to the row closest to the top) and since the firing of row $t_3$ turns OFF column $p_1$, the row $t_5$ will have to wait until the resource becomes free again.

AN EMBODIMENT OF THE LOGIC ARRAY

In this embodiment of the logic array, the rows of the array are each made up of a group of row conductors $s$, $r$ and $\bar{r}$, and the columns are each made up of a group of three column conductors $c$, $p$ and $\bar{p}$. At the intersection of a row and a column, diodes connect some column conductors to some row conductors in different configurations to constitute different interconnection configuration for the cell (FIG. 6). When conductor p is in high state the said column is said to be in the "ON" state and when conductor $\bar{i}$ is in low state then the row is said to be in "ON" state. Firing a row involves once turning "ON" and then turning "OFF" the row.

At the edge, the conductors of a column are connected to a place circuit which in addition to providing a means for connecting the input and output wires of the array to the column, also determine (hold) the state of the column and also provide a means for changing the state of the column in response to the firings of the rows. In this embodiment of the logic array there are three kinds of place circuits (FIG. 7); one provides an output wire of the array from that column of the array; another connects an input wire to that column; and the third is used when the column is not connected to any input or output wires. Diagrams for these circuits are shown in FIG. 7.

Firing a row generates a 1-to-0 change followed by a 0-to-1 change on the c conductors of all columns connected to that row by either the "dot" or "cross" configuration. The changes in the level of the c conductor causes the connected place circuit to change the state of the column (the level of p conductor; $\bar{p}$ is logical complement of p) at appropriate time as shown in the diagrams of FIG. 7. The JK flip-flops used in these diagrams all operate on the 0-to-1 edge (rising edge) of the input c. Because J and K are both set to high level, the flip-flop undergoes a flip (change) in state at the 0 to 1 edge of input c. The conductors of a row are connected to a set reset flip-flop at one edge.

At the interconnection cell, diodes can connect row conductors s, r and $\bar{i}$ to column conductors, p, $\bar{p}$ and c respectively. In the "dot" configuration all these diodes are present; in the "cross" configuration only the one connecting s conductor to the p conductor is present; and in "0" configuration only the one connecting r conductor to the $\bar{p}$ conductor is present. In the "null" configuration none of the diodes are present; that is, there is no direct connection between the column and the row passing through that cell.

The diodes connected to the s conductors of the rows form AND gates whose inputs are the p conductors of the columns; the diodes connected to the r conductors form AND gates whose inputs are the $\bar{p}$ conductors; and the diodes connected to the c conductors of the column form AND gates whose inputs are the $\bar{i}$ conductors of the rows.

Infact, the s conductor of a particular row forms an AND gate whose inputs are the p conductors of all columns connected to that row by either a "dot" or a "1"; r conductor of a particular row forms an AND gate whose inputs are the $\bar{p}$ conductors of all columns connected to that row by either a "dot" or a "0"; the c conductor of a particular column forms an AND gate whose inputs are the $\bar{i}$ conductors of all rows connected to that column either by a "cross" or a "dot".

Now we can trace the steps in the firing of a row starting from the condition when all columns connected to it by "dot" are in "OFF" state. In this condition the s and r conductors of the row will be in states 0 and 1 respectively and therefore the set-reset flip-flop connected to the row conductors will be in "OFF" state, and $\bar{i}$ conductor will be in high (1) state. When any of the above mentioned columns turn to "ON" state either becomes of an external input or becomes of firing of some other row, the r conductor of the row will become a 0 but s conductor must still wait to become a 1. When the states of all columns connected to that row becomes "ON" then s conductor state become a 1, the said set reset flip-flop turns "ON" i.e. the row turns "ON". Turning "ON"]of the row commences the duration of time the row goes through the act of firing.

As soon as the state of the row turns "ON" the $\bar{i}$ conductor state changes to a 0 and thus the c conductors of all columns connected to that row by either a "dot" or a "cross" experiences a 1 to 0 change. The columns connected to the row by "dots" are necessarily either input or internal columns of the array, and are in "ON" state at the time the row turns "ON". Therefore, from the specification of the place circuits of FIG. 7 one sees that these columns now turn "OFF". When all of the columns connected to the row by "dots" turn "OFF" then the s and r conductors of the row return to the states 0 and 1 respectively, and in response the set-reset flip-flop of the row turns OFF; the state of $\bar{i}$ returns to a 1 and the c conductors connected to $\bar{i}$ conductor returns to level 1. This change in level of the c conductor only affects the place circuits of the columns connected to that row by the "cross" configuration; these place circuit flip their state and the state of these said columns changes from their present state to the opposite state. This completes the explanation of the operation of this embodiment of the array, except for the explanation of the role played by the arbiter which we describe below.

The need for arbiter arises because the rows fire independently and asynchronously of one another except for the interaction set forth by means for the connections to the columns. It may so happen that more than one row have a column common to them to which they are connected by a "dot" configuration and they are all ready to fire. There is a conflict among the rows with regard to which row fires first because firing of one row eliminates the possibility of another row being fired because they both need to find the columns in "ON" state in order to fire. Such conflicting rows must not be allowed to fire simultaneously otherwise timing problems may arise.

Arbiters are placed in between the row conductors and the set-reset flip-flop connected to the row conductors. The function of the arbiter is as follows: If only one row connected to the arbiter is ready to fire then to allow the row to fire without any obstruction; If several rows are ready to fire at the same time then to let the row closest to the top to fire and block the firing of the other rows until the selected row has completed firing. If a row which is below gets ready to fire first and a row above it gets ready to fire after a critical time, then there is a case of genuine conflict and the arbiter may pick any one of them to fire but not both (the firings are still sequenced).

The arbiter exercises control over the firing of transitions by controlling the propagation of the 0 to 1 level changes from the s conductors to the s input of the corresponding set-reset flip-flops. Even if several s conductors change state from 0 to 1 at the same time (or nearly the same time) only one s output of the arbiter changes from 0 to 1 the other 0 to 1 changes are blocked at the arbiter as long as the row whose signal on s wire was allowed to go through the arbiter is in the process of firing. A circuit embodiment of such an arbiter utilizing an elementary arbiter circuit is shown in FIG. 8.

Details on elementary arbiters may be found in an earlier Patent granted to this inventor (U.S. Pat. No. 3,824,409, July 1974). The c circuit in FIG. 8 is the well Muller's c circuit (known to designers of structured asynchronous circuits). Basically the c circuit is a kind of flip-flop whose output changes to a 1 when both inputs are a 1 and to a 0 when both inputs are a 0. The elementary arbiter is one which is biased towards favoring inputs closer to the top.

PREFERRED EMBODIMENT OF THE LOGIC ARRAY

In implementation a logic array in LSI technology the objective is to fit as large array on a single integrated chip as is possible. This means one should reduce the number of conductors for the columns and the rows as much as possible. At the same time because the array is all on one single integrated chip it is possible to know and control signal propagation delays in some limits. The following embodiment of the array makes use of this fact to reduce the number of column and row conductors. Even though, internally the logic array makes use of the knowledge about timing delays, to the outside it completely resembles like an asynchronous logic array. Another advantage of this embodiment is that it can also operate as a synchronous logic array if an appropriate clock input is provided.

OVERVIEW

FIG. 11 shows the implementation of the array which realizes the Petri net of FIG. 9. FIG. 10 shows a representation of the net of FIG. 9 in the matrix notation. FIG. 11 is also organized into parts which form columns and rows. Some columns are split into segments. Each column (or a column segment) has a place circuit which is connected to the conductors of the column, and each row has a circuit which feeds current into the conductors of the row. Rows which need arbitration, are connected to arbiters. Diodes at the intersection of the conductors of the column and that of the row determine the cell configuration connecting the column and the row. FIGS. 12, 13, 14 and 15 give details of the components used in this embodiment of the logic array. Discussion of the Components. FIG. 12 shows a state diagram of the edge triggered flip-flop with input i and output Q. The flip-flop has two states ON and OFF. In ON state Q is 1 and in OFF state Q is 0. A 0 to 1 change in the level of i flips the state of the flip-flop.

FIG. 13 shows a $\xi$ circuit. This circuit has outputs $Q_1$ and $Q_2$ and input i. The 0 to 1 changes in the level of i flip the levels of $Q_1$ and $Q_2$ alternately. When the device is initialized, $Q_1$ and $Q_2$ are both at level 0 and $Q_1$ is the first one to flip.

FIG. 14a shows different types of delays used in the circuit of the logic array. The rise time delays only the 0 to 1 (the positive edges) changes. The 1 to 0 changes go through the delay unit without much delay. A possible circuit embodiment for such a delay is shown in FIG. 14b.

FIG. 15 shows an elementary arbiter. Details of elementary arbiters can be found in literature and an earlier patent granted to this inventor (U.S. Pat. No. 3,823,409, July 1974). The elementary arbiter has two inputs and corresponding two outputs. Ordinarily an output wire immediately follows the level changes taking place on the corresponding input wires except when the change would cause both output wires of the arbiter (or more than one output wires in the care of a multi input arbiter) to be at level 1. In such a case the change (in level of output) is delayed until it can be changed without violating the above mentioned criterion.

The arbiter that is used here has latening delay. After it is released by one input the arbiter becomes latent (inactive) for some predetermined length of time. At the end of this period it gets engaged to any input that might be waiting. If no inputs are waiting then the arbiter just waits for an input. Note that 1 to 0 changes go through arbiter without any trouble. FIG. 7b shows a circuit for a two input arbiter with latency delay and a bias for input X. Explanation about the Embodiment of the Array. Columns which represent input places, internal places and ready/acknowledge link have two column conductors each (conductors i and p). The state of the p conductor indicates whether the column is ON or OFF (place has a token or it is empty). State 1 (ON state) means that place P has a token and state 0 (OFF state) means that the place is empty. The conductor i is used to change the state of the place. The i conductor is an output of the diode matrix and p conductor an input to the matrix.

The Boolean column has two conductors one representing the value of the Boolean variable and another its complement. Both conductors are inputs to the diode matrix.

The column representing output place has only one conductor i (the p conductor is not needed). This conductor is an output conductor of the diode matrix.

The rows that correspond to the transitions that do not participate in arbitration each have a single conductor. The conductors forms an AND logic of all column conductors (inputs) connected to it. All column output conductors connected to this output get signals from this row conductor. A column output conductor (e.g. conductor i) forms a logical OR of all row conductor connected to it.

The diode matrix thus represents a combination of AND and OR matrices.

The rows that correspond to the transition that participate in arbitration each have two conductors. One conductor is connected to all input column conductors and to the input of the arbiter. The other conductor is connected to the corresponding output of the arbiter and drives all column output conductors connected to it. When such a row gets ready to fire (all input columns are ON and the Boolean columns have desired values), the signal from the input conductor must reach the output conductor by way of the arbiter in order to fire. The arbiter has been placed there to ensure that only one row fires at a time among the selected rows which are connected to the arbiter. The delays which are placed between the flip-flops in the place circuits and the p conductors of the column essentially delay turning on of the columns. Because the delays are only positive edge delay, turning OFF of the column is not delayed. This is an important mechanism to ensure that when a row fires the input columns have sufficient time to turn OFF before the output column turn ON.

OPERATION OF THE ARRAY

Let us follow the operation of the array with the aid of the specific array of FIG. 11 which realizes the Petri net of FIG. 9.

Initially all place circuits are reset to OFF condition (also suppose a and c are at level 0). Then suppose a positive pulse is applied on the conductor of row $t_0$. This pulse will set the place h; thus h will get the initial token. (Another way to provide the initial tokens is by providing the array with an extra input place and after the place circuits have been reset to send a signal (token) to this input place. Thus a row such as $t_0$ can fire and put tokens in necessary places).

The system now waits for a signal on input a and c. Suppose a signal is received on a (Note that a signal is just a level change, either from 0 to 1 or 1 to 0. In this case from 0 to 1). If $x$ is at level 0, then row $t_1$ will have to wait for $x$ to become a 1. Suppose this is indeed the case.

Now suppose a signal is received on c before $x$ becomes a 1. Column c then turns ON and row $t_3$ is enabled (the fact that wires $p_c$ and $p_h$ are at level 1 makes $t_3^i$ high-$t_3$ is thus enabled). Because the arbiter is not engaged to anyone, this 0 to 1 change goes through the arbiter and $t_3^0$ becomes high. $t_3^0$ makes $i_e$, $i_f$, $i_h$ conductors high. Column c and h get runed OFF (the flip-flops in the place circuits of their columns flip and make wires $p_c$ and $p_h$ 0), the $Q_1$ output of the place circuit for f flips and column i turns ON after some time (turning ON of i is delayed by the positive edge delay in its place circuit). Infact, before i turns ON, conductor $t_3^i$ turns 0 and output conductor $t_3^0$ turns to 0. Now suppose $x$ changes to a 1. Then $t_1$, which had been waiting for $x$ to become 1, gets enabled ($t_1$ becomes high). Column a thus turns OFF (because $i_a$ gets a 0 to 1 change) and column e is set to become ON. Before e becomes ON, to returns $t_i$ a 0 and then e becomes ON. Now $t_2$ cannot become enabled so long as h is empty ($t_2$ has to wait for a new token in h, h must turn ON).

Now suppose an acknowledge signal is received on f. Then column f turns ON and row $t_6$ becomes enabled. Firing of this row turns OFF columns f and i, turns ON h and flips the state of d. Note that f turns OFF because in this case the 0 to 1 change on $i_f$ flips $Q_2$ which causes $p_f$ to become low.

Now row $t_2$ is enabled ($t_2^i$ becomes high) and the arbiter allows the high level of $t_2^i$ to propagate to $t_2^0$. $i_e$, $i_g$, $i_f$ and $i_h$ thus become high. Columns e and h are turned OFF and $t_2^i$ becomes 0 and then $t_2^0$ becomes 0. The 0 to 1 transitions on $i_f$ and $i_g$ would have set their column in motion to send a ready signal on f and turn ON g respectively. These actions take place after $t_2^0$ has become 0. When f acknowledges, row $t_4$ fires and turns OFF columns f and g and turns on column h and the column segment j. Firing of row $t_5$ has to wait for $x$ to become 0. When $x$ becomes 0, row $t_5$ fires and output b flips (a signal is sent out on b).

OPERATION OF THE ARBITER IN CONFLICT RESOLUTION

Suppose that in the above array, rows $t_2$ and $t_3$ get enabled at the same time. The conductor $t_2^i$ and $t_3^i$ change from 0 to 1 at the same time. Both inputs of the arbiter thus experience a 0 to 1 change at the same time. The arbiter then performs arbitration and selects one of the inputs. The selected input is allowed to produce a 0 to 1 change on the corresponding output conductor and the other input is blocked at the arbiter. (The arbiter generally offers its service to whichever input comes first. But when it is presented with both inputs at the same time, it selects the one near the top). In any case the arbiter blocks all but one input; the row whose input is not blocked (say the one from $t_2$ is not blocked) completes firing. In this case $t_2$ will fire. First $t_2^0$ will change from 0 to 1. This change will produce 0 to 1 changes on $i_e$, $i_f$, $i_g$ and $i_h$. Columns e and h will be turned OFF; column f will be set to produce a ready signal on link f and column g will be set to turn ON after some time. As soon as either e or h columns turns OFF, $t_2^i$ becomes 0. Immediately following this $t_2^0$ becomes 0 and the arbiter is released.

Because of the latency delay, the arbiter will not be ready to pass any signals for some predetermind length of time. Before this time runs out, $t_3$ will get disabled ($t_3^i$ will become 0) because column h has been turned OFF. Row $t_3$ will thus have to wait for a new token in place h.

IMPORTANT FEATURES OF THE ABOVE EMBODIMENT

1. Each column consists of at most two conductors. Columns representing internal places (columns e, j, g, h and i), columns representing input places (columns a and c) and the columns representing calls to operators (the ready/acknowledge links) need two conductors to a column (i and p). But columns representing the output places need just one conductor each (only the i).

2. The polarity of all diodes is the same; they connect the row and the column conductors in the same direction. This allows the whole diode array to be a single diode matrix. If diodes in different directions are used, separate diode matrices may be required.

3. A single column can represent a ready/acknowlede link such as needed in controlling an asynchronous operator. A signal goes out on the ready wire when signals corresponding to putting a token are applied to the column. The column actually gets the token only when a signal is received on the acknowledge wire in response to the signal that was sent on the ready wire.

4. A column can be segmented into many segments, each of which is provided with its own place circuit. When a column is split into segments, then each segment implements a distinct place. This results in considerable savings in the number of columns that are needed in realizing digital systems.

5. Only the rows which represent the transitions that are controlled by arbiters need two wires each. Other rows only have one wire each.

6. At most, two diodes are needed in each cell. A cell is an intersection of a column and a row.

PROGRAMMABLE ARRAY

If a diode is replaced by a transistor in the array, then depending on what level is applied to the base of the transistor it behaves like either a diode or an open circuit.

Thus if the diodes in the array are replaced by transistors and the base of the transistors connected to memory elements then the contents of the memory will determine the diode pattern and hence the specialization (programming) of the array.

If it is economical, the whole array can be made programmable. Otherwise a few rows and a few columns can be made programmable. This will allow bad rows to be inhibited and replaced by programmable rows. Self repairable array can be constructed in this manner. This can be the basis for a highly reliable digital system. Program stop (break point) and debugging. A break point can be placed on any transition by making that transition have a new place as an additional input. If the place is left blank then the break point will be in effect; even if the other inputs are there, the transition will not fire. Putting a token in that place will allow the transition to fire once (allow the system to go past that break point once). Clocked Array. If desired the flip-flops of the array can be clocked either because a clocked system is desired or to follow the operation of the array. D type flip-flop (latches) can be useful for this purpose.

Clocked operation can also be obtained if the clock is connected to a Boolean column and all transitions which are to fire at instances designated by the clock are provided with 1 (or a 0) in the column of the clock input.

If the array is to be used only as a clocked system then the exhibits delays in the array are not needed.

What is claimed is:

1. A logic array comprising a plurality of groups of column conductors and plurality of groups of row conductors arranged in a substantially orthogonal relationship, each group of column conductors being called a column, each group of row conductors being called a row, and each row and each column is connected by one of at least five types of connections which are characterized as a "dot" connection, a "cross" connection, a "1" connection, a "0" connection and a "null" connection;

each column and row being in one of two states, an "ON" state and an "OFF" state;

a row "firing" when every column connected to that row by a "dot" or a "1" connection is "ON" and every column connected to that row by a "0" connection is on "OFF";

means to change the state of the columns in response to "firings" of rows, the said means turning "OFF" columns connected to a "firing" row by a "dot" connection, and said means changing the state of the columns connected to a "firing" row by a "cross" connection;

a plurality of arbiters, each arbiter being connected to plurality of selected rows, the rows which are not connected to an arbiter firing independently of another where as those rows connected to an arbiter "fire" in succession and not at the same time;

means for connecting inputs to selected columns to cause the states of the selected columns to be altered in accordance with changes in the state of inputs, means for connecting selected columns to provide outputs where the state of the output is determined by the state of the selected columns.

* * * * *